(12) United States Patent
Hongoh et al.

(10) Patent No.: US 7,569,497 B2
(45) Date of Patent: Aug. 4, 2009

(54) METHOD AND APPARATUS FOR FORMING INSULATING LAYER

(75) Inventors: Toshiaki Hongoh, Nirasaki (JP); Satohiko Hoshino, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 316 days.

(21) Appl. No.: 11/041,303

(22) Filed: Jan. 25, 2005

(65) Prior Publication Data

US 2005/0148167 A1 Jul. 7, 2005

Related U.S. Application Data

(63) Continuation-in-part of application No. PCT/JP03/09696, filed on Jul. 30, 2003.

(30) Foreign Application Priority Data

Jul. 30, 2002 (JP) ............................. 2002-221585

(51) Int. Cl.
*H01L 21/31* (2006.01)
(52) U.S. Cl. .................. 438/780; 438/781; 438/788; 438/790; 438/795; 257/E21.269; 257/E21.274
(58) Field of Classification Search ................. 738/780, 738/781, 788–790, 795
See application file for complete search history.

(56) References Cited

U.S. PATENT DOCUMENTS 5,317,081 A * 5/1994 Gelorme et al. ............. 528/353
5,326,643 A * 7/1994 Adamopoulos et al. .. 428/472.2
5,863,376 A * 1/1999 Wicker et al. .......... 156/345.38
6,355,573 B1 * 3/2002 Okumura et al. ............ 438/709
6,399,520 B1 * 6/2002 Kawakami et al. .......... 438/778
6,470,824 B2 10/2002 Kawakami et al.
2002/0127807 A1 * 9/2002 Usami ........................ 438/287
2005/0227500 A1 * 10/2005 Sugawara et al. ........... 438/785

FOREIGN PATENT DOCUMENTS

| JP | 8-236520 | 9/1996 |
|---|---|---|
| JP | 10-150036 | 6/1998 |
| KR | 2000-0076774 | 12/2000 |
| WO | WO 00/18847 | 4/2000 |
| WO | WO 01/70628 A2 | 9/2001 |

OTHER PUBLICATIONS

Patent Abstracts of Japan, JP 57-103333, Jun. 26, 1982.

* cited by examiner

*Primary Examiner*—Hsien-ming Lee
(74) *Attorney, Agent, or Firm*—Oblon, Spivak, McClelland, Maier & Neustadt, P.C.

(57) ABSTRACT

In a method for forming an insulating film, a film containing an organic curable material and provided on a substrate for an electronic device is irradiated with an energy plasma produced by a microwave irradiation through a planar antenna member having a plurality of slits to thereby cure the film containing the organic curable material and form the insulating film having a dielectric constant of 3 or less.

12 Claims, 3 Drawing Sheets

METHOD AND APPARATUS FOR FORMING INSULATING LAYER

This application is a Continuation-In-Part application of PCT International Application No. PCT/JP03/09696 filed on Jul. 30, 2003, which designated the United States.

FIELD OF THE INVENTION

The present invention relates to a method for forming an insulating film by curing a film containing a curable organic material formed on a substrate for an electronic device by employing a low energy plasma.

BACKGROUND OF THE INVENTION

The present invention can be widely employed in fabricating a semiconductor and/or electronic device material for semiconductor device, a liquid crystal device or the like. For the convenience of explanation, a background technology of a semiconductor device will now be exemplarily illustrated.

Semiconductor devices have been conventionally developed to achieve an ever higher integration and performance level by reducing the design rule. However, if the design rule becomes finer (for example, equal to or less than 0.18 µm or so), a wiring resistance and an inter-wiring capacitance are increased considerably and hence it becomes difficult to improve the performance of a device beyond a certain level in case of using a conventional wiring material.

For example, in order to increase an operating speed of a semiconductor device, it is necessary to enhance the speed of an electric signal. However, if a semiconductor device having a conventional aluminum wiring is scaled down to the aforementioned level (for example, equal to or less than 0.18 µm or so), there occurs a limit in the speed of an electric signal flowing in a circuit of the semiconductor device (a so-called wiring delay occurs). Therefore, it becomes necessary to employ a wiring made of a material such as Cu having a lower electric resistance than that of aluminum. Cu has a characteristic that a wiring delay is small and thus electricity can flow smoothly even in a wiring of a small cross section, due to its lower electric resistance than that of aluminum.

In case of using such a material as Cu having a low electric resistance as described above, an insulating film employed therefor needs to be the one capable of more effectively preventing the leak of electricity therethrough. This is because, with such a combination of a Cu wiring through which electricity is easy to flow and an insulating film through which electricity is difficult to leak, a semiconductor device operating at an extremely high speed can be manufactured.

A $SiO_2$ film (a relative dielectric constant=4.1) was employed as an insulating film in the era of the conventional aluminum wiring. However, in case of employing a Cu wiring, an insulating film having a far lower relative dielectric constant (Low-k) than that of the $SiO_2$ film becomes necessary. In general, a Low-k film stands for a film having a relative dielectric constant of 3.0 or less.

Two methods are conventionally known for producing such a Low-k film. One of the two methods is to employ a CVD apparatus. Though a high quality Low-k film can be produced by this method, the manufacturing productivity of the Low-k film is naturally low and, thus, the running cost thereof is high. The other method is to coat a fluidic Low-k material such as liquid on a substrate or the like by using, e.g., a spin coater (method for forming a so-called SOD (Spin On Dielectric) insulating film).

This coating method is advantageous in that its running cost is low and its productivity is high.

In the coating method, a process (a curing process based on a reaction of, e.g., a crosslinking) of curing a coating film coated on, e.g., a substrate should be carried out in order to improve the film quality of an insulating film. However, if wiring layers constituting a semiconductor device are of a multilayer for example, an excessive thermal budget is imposed on the corresponding coating films or the insulating films formed by the curing thereof, and as a result, there occurs a problem that the insulating films made up of the corresponding coating films can be easily degraded.

SUMMARY OF THE INVENTION

It is, therefore, a primary object of the present invention to provide a method for forming an insulating film without suffering from the problem of the prior art described above.

Another object of the present invention is to provide a method for forming an insulating film in which a high quality insulating film can be produced while preventing an excessive thermal budget from being imposed thereon.

The inventors of the present invention have carefully carried out research on the above and found that it is very effective for achieving the above-mentioned objects to irradiate a film containing an organic material with a low energy plasma to thereby cure the film.

In accordance with a first aspect of the present invention, there is provided a method for forming an insulating film, wherein a film containing an organic curable material and provided on a substrate for an electronic device is irradiated with an energy plasma produced by a microwave irradiation through a planar antenna member having a plurality of slits to thereby cure the film containing the organic curable material and form the insulating film having a dielectric constant of 3 or less.

In accordance with a second aspect of the present invention, there is provided a processing apparatus including: a mounting unit for mounting an object to be processed; a processing chamber having a dielectric material disposed to face the mounting unit; a slot electrode having slits and provided on the dielectric material; a wavelength shortening member for shortening a wavelength of a microwave and disposed on the slot electrode; an antenna accommodation member for accommodating the wavelength shortening member; and a temperature controlling member for controlling temperatures of the antenna accommodation member, the wavelength shortening member and the slot electrode.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENT

Figure 1:
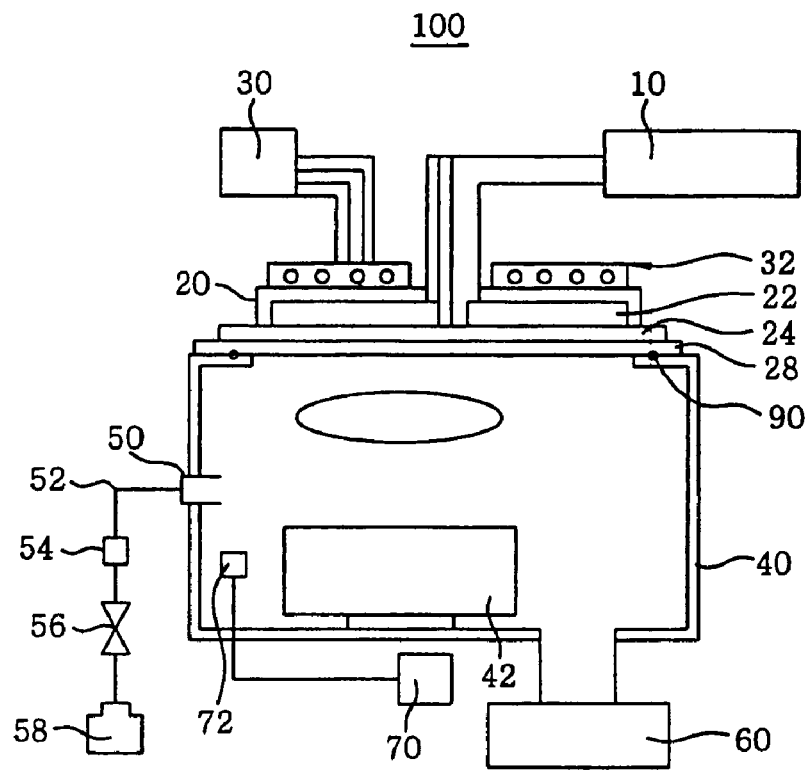
FIG. 1 provides a schematic block diagram showing a structure of a microwave plasma processing apparatus adequately employable for the present invention.

In the following, the present invention will be described in detail with reference to the accompanying drawings when necessary. In the following description, contents of material expressed in the unit of "%" are based on mass, unless mentioned otherwise.

(Method for Forming an Insulating Film)

In the method for forming an insulating film in accordance with the present invention, an organic material containing film having a curable material and provided on a substrate for electronic device is irradiated with a low energy plasma, thereby curing the corresponding film containing the curable material.

(Substrate for Electronic Device)

A substrate for electronic device, which can be employed in the present invention, is not limited to any particular one, but rather can be appropriately selected from any one or a combination of any kinds of known substrates for electronic device. Such substrates for electronic device can be, e.g., a semiconductor material, a liquid crystal device material and so on. The semiconductor material can be, e.g., a material mainly made of single crystalline silicon.

(On a Substrate for Electronic Device)

In accordance with the present invention, the phrase [on a substrate for electronic device] means that an insulating film to be formed is positioned above the substrate for electronic device (that is, on the upper side of the part formed of respective layers constituting the electronic device of the corresponding substrate). In other words, another insulating layer, a conductor layer (e.g., a Cu layer), a semiconductor layer and/or the like may be disposed thereunder. Further, more than one of any kinds of insulating layers including an insulating film to be formed in the present invention, conductor layers (e.g., Cu layers), semiconductor layers and/or the like may be disposed thereunder if necessary.

(Curable Material)

Though a curable material which can be employed in the present invention is not particularly limited, a curable material producing an insulating film having a dielectric constant of 3 or less after curing is preferable, for it can be preferably combined with a wiring material having a high conductivity such as Cu.

An organic insulating film having a low dielectric constant characteristic, e.g., with a dielectric constant of equal to or less than 3 after being cured can be employed as such a curable material. For example, organic polymers such as PAE-2 (from Shumacher Corp.), HSG-R7 (from Hitachi Chemical Co., Ltd.), FLARE (from Allied Signal Ltd.), BCB (from Dow Chemical Co.), SILK (from Dow Chemical Co.), Speed Film (from W. L. Gore and Associates, Inc.) can be used.

(Method for Forming a Curable Material)

Though a disposition method of the curable material on a substrate for electronic device is not particularly limited, it is preferable that a solution or a dispersion solution of a curable material having fluidity is coated on the substrate for electronic device. In view of uniformity, it is preferable to employ a spin coating method for the coating.

(Film Thickness)

Though film thicknesses before and after curing by plasma irradiation are not particularly limited in the present invention, the following film thicknesses can be appropriately employed.

<Film Thickness before Curing>

Preferably, 100 to 1000 nm or so, and more preferably 400 to 600 nm or so

<Film Thickness after Curing>

Preferably, reduction in film thickness by about several % (for example, 5 to 6%).

(Low Energy Plasma)

In accordance with the present invention, the curable coating film is irradiated with a low energy plasma. Herein, [a low energy plasma] implies that an electron temperature is 2 eV or less.

(Plasma Processing Conditions)

In forming an under film of the present invention, the following plasma processing conditions can be properly employed in consideration of characteristics of an insulating film to be formed.

A rare gas (e.g., Kr, Ar, He or Xe): 10 to 3000 sccm, and more preferably 200 to 500 sccm;

$N_2$: 10 to 1000 sccm, and more preferably 100 to 200 sccm;

Temperature: from room temperature (25° C.) to 500° C., more preferably from room temperature to 400° C., and most preferably 250 to 350° C.;

Pressure: 0.1 to 1000 Pa, more preferably 1 to 100 Pa, and most preferably 1 to 10 Pa;

Microwave: 1 to 10 $W/cm^2$, more preferably 2 to 5 $W/cm^2$, and most preferably 3 to 4 $W/cm^2$;

Processing time: 10 to 300 seconds, and more preferably 60 to 120 seconds (Example of Preferable Conditions)

In the present invention, the following exemplary conditions can be properly employed.

Microwave: 2 $kW/cm^2$

Gas: Ar 1000 sccm+$N_2$ 100 sccm, or

Kr 1000 sccm+$N_2$ 100 sccm

Pressure: 13.3 to 133 Pa

Substrate temperature: 350±50° C.

Processing time: 60 to 120 seconds (Desirable Properties of an Insulating Film)

In accordance with the present invention, a cured insulating film having the following desirable properties can be easily formed.

In the present invention, an employable plasma is not particularly limited as long as the low energy plasma can be irradiated. For easily obtaining the cured film with a substantially reduced thermal budget, it is preferable to use a plasma having a relatively low electron temperature and a high density. By forming the cured film with the substantially reduced thermal budget, the film can be prevented from being stripped off, and Cu or the like can be prevented from being diffused into the insulating film; and, therefore, it becomes possible to form a high quality insulating film. In particular, in case of processing a curable material with a low energy plasma at a temperature of 400° C. or less, an especially less damaged insulating film can be obtained.

(Desirable Plasma)

Characteristics of a properly employable plasma in the present invention are as follows:

Electron temperature: 1 eV to 2 eV

Density: $1E12\ cm^{-3}$ to $1E13\ cm^{-3}$

Uniformity of a plasma density: ±5% or less (Planar Antenna Member)

In a method for forming an insulating film in accordance with the present invention, it is preferable to form a plasma having a low electron temperature and a high density by irradiating microwave through a planar antenna member having a plurality of slots. In case of forming an insulating film by using a plasma having such an excellent property in accordance with the present invention, a process with particularly law plasma damage and also being highly reactive at a low temperature becomes possible. Further, the present invention is advantageous in that a higher quality insulating film can be easily formed by irradiating a microwave through a planar antenna member (compared with the case of employing the conventional plasma).

(A Preferred Embodiment of a Plasma Irradiating Apparatus)

In the following, with reference to the accompanying drawings, there will be described an exemplary microwave plasma apparatus 100 which can be employed as a plasma irradiating apparatus. Further, similar reference numerals in the respective drawings represent similar parts. Though the conventional microwave has a frequency of 1 to 100 GHz, the microwave of the present invention differs therefrom and has a frequency of about 50 MHz to 100 GHz.

Herein, FIG. 1 shows a schematic block diagram of the microwave plasma apparatus 100. The microwave plasma apparatus 100 of the preferred embodiment is coupled to a microwave source 10, a reaction gas supply nozzle 50 and a vacuum pump 60, and has an antenna accommodation member 20, a first temperature controller 30, a processing chamber 40 and a second temperature controller 70.

The microwave source 10 is made of, e.g., a magnetron and can typically generate microwave of 2.45 GHz (for example, 5 kW). Then, a transmission form of microwave is converted into TM, TE, TEM mode or the like by a mode converter (not shown). Further, in FIG. 1, an isolator absorbing a reflected wave of the generated microwave turning back to the magnetron, and an EH tuner or a stub tuner for matching with a load side are omitted.

The antenna accommodation member 20 accommodates therein a wavelength shortening member 22 then, and a slot electrode 24 in contact with the wavelength shortening member 22 serves as a bottom plate of the antenna accommodation member 20. A material having a high thermal conductivity (for example, aluminum) is used in the antenna accommodation member 20 and, as will be described later, a temperature control plate 32 is in contact therewith. Therefore, the temperature of the antenna accommodation member 20 is set to be approximately same as that of the temperature control plate 32.

The wavelength shortening member 22 is made of a material having a predetermined dielectric constant and a high thermal conductivity in order to shorten a wavelength of microwave. To make uniform a density of a plasma introduced into the processing chamber 40, a large number of slits 25 have to be formed in the slot electrode 24 to be described later. The wavelength shortening member 22 has a function of enabling to make it possible to form many slits 25 in the slot electrode 24. Employed as the wavelength shortening member 22 can be, e.g., alumina-based ceramic, SiN and AlN. For example, a relative dielectric constant $\epsilon_r$ of AlN is about 9 and a wavelength shortening ratio thereof is $n = 1/(\epsilon_r)^{1/2} = 0.33$. Accordingly, both a velocity and a wavelength of the microwave after passing through the wavelength shortening member 22 become 0.33 times those of the microwave before passing therethrough, whereby a distance between the slits 25 of the slot electrode 24 to be described later can be shortened and, thus, a large number of slits 25 can be formed therein.

The slot electrode 24 is screw-fixed to the wavelength shortening member 22 and made up of, e.g., a cylindrical copper plate having a diameter of 50 cm and a thickness of 1 mm or less. The slot electrode 24 is provided with a plurality of slits 25 formed therein one after another, starting from a location slightly (e.g., about several cm) apart outward from a center and towards a peripheral portion in a spiral shape, as shown in FIG. 2.

Figure 2:
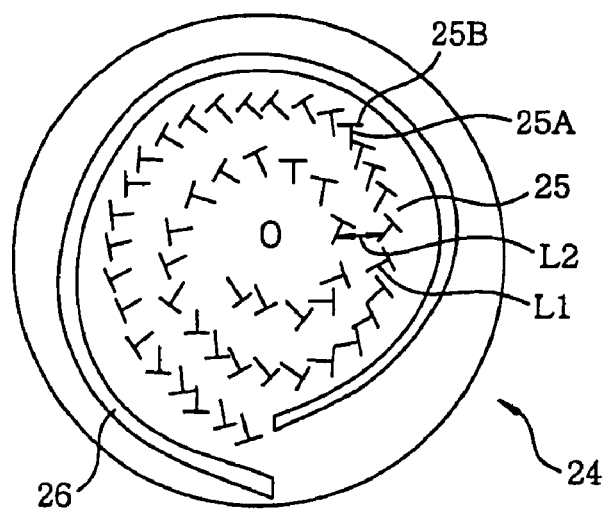
FIG. 2 shows a schematic plan view explaining a concrete example of a configuration of a slot electrode for use in the microwave plasma processing apparatus illustrated in FIG. 1.

In FIG. 2, the slits 25 are shown to make two spiral turns. In the preferred embodiment, a group of slits is formed by disposing slit pairs as described above, each slit pair being a set composed of two slits 25A and 25B placed slightly apart from each other in an approximate T-shape. A length L1 of each of the slits 25A and 25B is set to be ranged about from 1/16 to 1/2 of a wavelength λ of microwave in a waveguide and a width thereof is set to be 1 mm or so; and a distance L2 between an outer turn and an inner turn of the spiral slits is set to be of about the same length as the wavelength λ in the waveguide, though it may be slightly adjusted. That is, the length L1 of the slit is set to be within a range indicated in the following equation.

$$\frac{\lambda 0}{16} \times \frac{1}{\sqrt{\epsilon_t}} \leq L1 \leq \frac{\lambda 0}{2} \times \frac{1}{\sqrt{\epsilon_t}} \quad \text{(Equation 1)}$$

$\epsilon_t$: relative dielectric constant

By forming each of the slits 25A and 25B in such a manner, it makes possible to distribute microwave uniformly in the processing chamber 40. A radiation element 26 for antireflection of microwave power having a width of several mm or so may be formed outside the spiral slits along a peripheral portion of the disk-shaped slot electrode 24 (This can be omitted), thereby increasing an antenna efficiency of the slot electrode 24. Moreover, the slit shape of the slot electrode 24 in the preferred embodiment is just for an example and, thus, an electrode having any slit shape (e.g., a L-shape) can be employed as the slot electrode.

Figure 3:
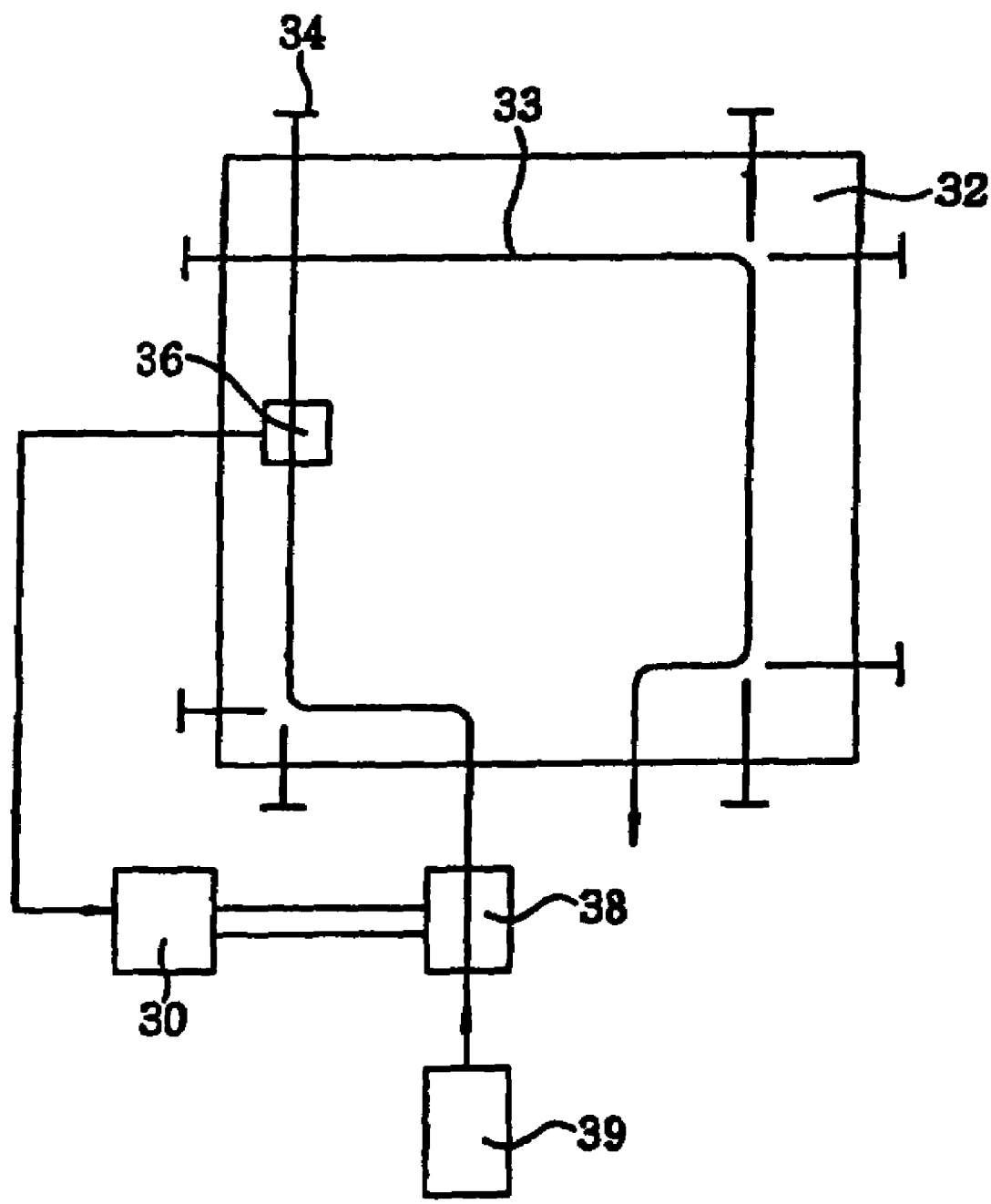
FIG. 3 describes a schematic block diagram showing a configuration of a first temperature controller and a temperature control plate for use in the microwave plasma processing apparatus illustrated in FIG. 1.

Coupled to the antenna accommodation member 20 is the first temperature controller 30. The first temperature controller 30 functions to control temperature variations of the antenna accommodation member 20 and the structural elements thereabout by microwave heating to be in a predetermined range. As shown in FIG. 3, the first temperature controller 30 is associated with a temperature control plate 32, a sealing member 34, a temperature sensor 36 and a heater device 38, and supplies cooling water from a water source 39 such as a water tap. For easy control, it is desirable that the temperature of cooling water supplied from the water source 39 is constant. The temperature control plate 32 is made of a material, e.g., stainless steel or the like, which has a good thermal conductivity and is easy to machine a flow path 33 therethrough. The flow path 33 can be produced by forming through holes row-and column-wise across the temperature control plate 32 of, e.g., a rectangular shape, and screwing the sealing members 34 such as screws into the through holes. Regardless of FIG. 3, the temperature control plate 32 and the flow path 33 can have any shapes, respectively, and a different kind of coolant (alcohol, Galden (trademark), flon or the like) can also be used instead of the cooling water.

Employed as the temperature sensor 36 can be such a known sensor as a PTC thermistor and an infrared sensor. Further, a thermocouple can also be used as the temperature sensor 36, but it is preferable to configure the thermocouple not to be affected by the microwave. The temperature sensor 36 may or may not be in contact with a flow path 33. Alternatively, the temperature sensor 36 may measure the temperatures of the antenna accommodation member 20, the wavelength shortening member 22 and/or the slot electrode 24.

The heater device 38 is made up of, e.g., a heater line wound around a water pipe connected to the flow path 33 of the temperature control plate 32. By controlling an amount of current flowing in the heater line, the temperature of water flowing in the flow path 33 of the temperature control plate 32 can be adjusted. Since the temperature control plate 32 has a high thermal conductivity, the temperature thereof can be controlled to be approximately same as that of the water flowing in the flow path 33.

The temperature control plate 32 is in contact with the antenna accommodation member 20, and the antenna accommodation member 20 and the wavelength shortening member 22 have high thermal conductivities. As a result, by controlling the temperature of the temperature control plate 32, the temperatures of the wavelength shortening member 22 and the slot electrode 24 can be controlled.

But for the temperature control plate 32 or the like, an electric power (for example, 5 kW) applied from the microwave source 10 to the wavelength shortening member 22 and the slot electrode 24 for a long time would raise the temperature of the electrode itself due to a power loss in the wavelength shortening member 22 and the slot electrode 24. Consequently, the wavelength shortening member 22 and the slot electrode 24 are deformed by thermal expansion.

For example, an optimum slit length of the slot electrode 24 is changed by thermal expansion, so that an entire plasma density in the processing chamber 40 to be described later becomes lowered or locally concentrated. If the entire plasma density is lowered, a processing speed of a semiconductor wafer W is changed. As a result, in case of making a control of a plasma processing on a time basis, in such a manner that the semiconductor wafer W is set to be unloaded from the processing chamber 40 after stopping the processing when a predetermined time (for example, 2 minutes) has passed, a desired processing (etching depth or formed film thickness) may not be performed on the semiconductor wafer W if the entire plasma density is lowered. In addition, if a plasma density is locally concentrated, a processing carried out on the semiconductor wafer W is locally changed. Accordingly, if the slot electrode 24 is deformed by the temperature variation, a quality of the plasma processing is deteriorated.

Further, without the temperature control plate 32, the slot electrode 24 is bent since the wavelength shortening member 22 and the slot electrode 24 are formed of different materials and both are screw-fixed. It is to be appreciated that the quality of the plasma processing is deteriorated in this case also.

On the other hand, the slot electrode 24 is not deformed even though it is disposed at a high temperature, as long as the temperature is constant. Further, in a plasma CVD apparatus, if water exists in a liquid phase or a vapor phase in the processing chamber 40, the water is introduced as an impurity into a film of the semiconductor wafer W and, therefore, the temperature has to be increased as high as possible. Moreover, in consideration of the fact that a member such as an O-ring 90 sealing up the gap between the processing chamber 40 and the dielectric material 28 has a heat resistance ranging from 80 to 100° C. or so, the temperature of the temperature control plate 32 (that is, the slot electrode 24) is controlled to be, e.g., 70±5° C. The set temperature of 70° C. or the like and the permissible temperature range of ±5° C. or the like can be adaptively set according to a required processing, heat resistances of structural parts and the like.

In this case, the first temperature controller 30 obtains the temperature information from the temperature sensor 36 and controls a current (for example, by employing a variable resistor and so on) supplied to the heater device 38 in order that the temperature of the temperature control plate 32 may become 70° C.±5° C. The slot electrode 24 is designed to have an optimum slit length on condition that it is used at 70° C., namely, it is placed in 70° C. atmosphere. Alternatively, in case the temperature sensor 36 is disposed on the temperature control plate 32, a somewhat wider permissible range, e.g., 70° C.±10° C. may be set since it takes time to conduct heat from the temperature control plate 32 to the slot electrode 24 or vice versa.

The first temperature controller 30 may supply the temperature control plate 32 with water controlled to have a temperature of 70° C. or so by initially operating the heater device 38 since, at first, the temperature of the temperature control plate 32 placed at the room temperature is lower than 70° C. Alternatively, water may be prevented from flowing in the temperature control plate 32 until the temperature thereof rises up to around 70° C. by microwave heating. Thus, an exemplary temperature controller shown in FIG. 3 may include an opening/closing valve and a mass flow controller controlling a flow rate of water from the water source 39. In case the temperature of the temperature control plate 32 is over 75° C., cooling thereof is started by supplying water of, e.g., 15° C. or so from the water source 39 thereto and, then, the heater device 38 is operated when the temperature sensor 36 indicates 65° C., so that the temperature of the temperature control plate 32 is controlled to be 70° C.±5° C. By using the mass flow controller and the opening/closing valve mentioned above, the first temperature controller 30 can adopt various kinds of control methods such that cooling of the temperature control plate 32 is started by supplying water of, e.g., 15° C. or so from the water source 39 and then supplying water is stopped when the temperature sensor 36 indicates 70° C., and so forth.

Thus, the first temperature controller 30 is different from a cooling device of Japanese Patent Laid-open Application No. H3-191073, in that the first temperature controller 30 controls the temperatures of the wavelength shortening member 22 and the slot electrode 24 to be in a permissible temperature range having a set temperature at the center thereof, while those are merely cooled down without setting such temperatures in the prior art cooling device. Accordingly, a processing quality in the processing chamber 40 can be maintained. For example, it is to be noted that in case the slot electrode 24 is designed to have an optimum slit length when it is placed under 70° C. atmosphere, an optimum processing environment cannot be obtained by merely cooling it down to 15° C. or so.

Besides, the first temperature controller 30 simultaneously controls the temperatures of the wavelength shortening member 22 and the slot electrode 24 by controlling the temperature of water flowing in the temperature control plate 32. This is due to the fact that the temperature control plate 32, the antenna accommodation member 20 and the wavelength shortening member 22 are made of materials having high thermal conductivities. Since the temperatures of these three can be controlled all together by using one device by employing such configuration, plural devices are not needed and thus scaling up and cost up of the entire apparatus can be prevented. Further, it should be noted that the temperature control plate 32 is just an example of a temperature control device and, thus, other type of cooling device, such as a cooling fan or the like can be employed.

Figure 4:
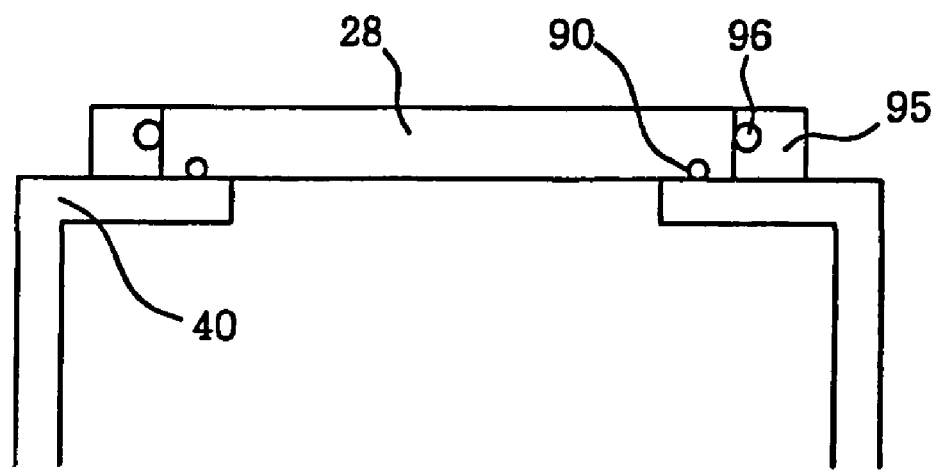
FIG. 4 sets forth partially enlarged cross sectional view explaining a third temperature controller 95.

Next, referring to FIG. 4, there will be described a third temperature controller 95. Herein, FIG. 4 is a partially enlarged cross sectional view for explaining the third temperature controller 95. The third temperature controller 95 controls the temperature around the dielectric material 28 by using, e.g., cooling water or a coolant. The third temperature controller 95 can be implemented, in a similar manner as in the first temperature controller, by employing a temperature sensor and a heater device and, thus, a detailed description thereof is omitted.

Figure 5:
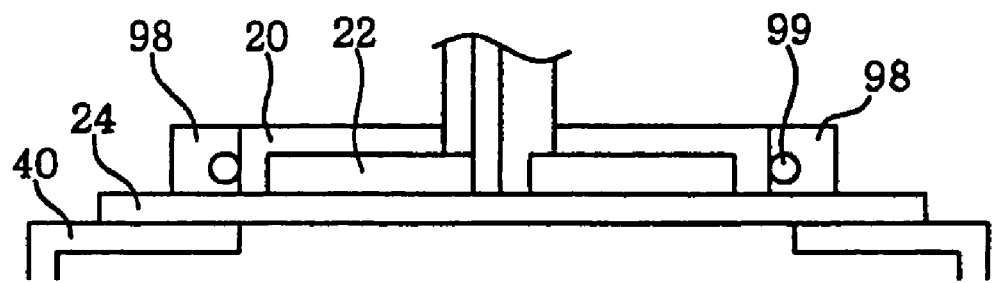
FIG. 5 depicts partially enlarged cross sectional view showing an exemplarily modification of the temperature control plate in the microwave plasma apparatus illustrated in FIG. 1.

In the present embodiment, though the temperature control plate 32 and the antenna accommodation member 20 are separate parts, the antenna accommodation member 20 may be configured to have functions of the temperature control plate 32. For example, by forming the flow path 33 on a top surface and/or a side surface of the antenna accommodation member 20, the antenna accommodation member 20 can be cooled directly. Moreover, by forming a temperature control plate 98 having a flow path 99 similar to the flow path 33, on the side surface of the antenna accommodation member 20 as shown in FIG. 5, the wavelength shortening member 22 and the slot electrode 24 can be cooled simultaneously. Herein, FIG. 5 provides a partially enlarged cross sectional view showing a modification of the temperature control plate 32 in the microwave plasma apparatus 100 illustrated in FIG. 1. Further, a temperature control plate may be disposed around the slot electrode 24, or a flow path can be formed in the slot electrode 24 itself without interfering with an arrangement of the slits 25.

The dielectric material 28 is placed between the slot electrode 24 and the processing chamber 40. The slot electrode 24 and the dielectric material 28 are surface contacted strongly and air-tightly by, e.g., blazing. Alternatively, the slot electrode 24 made of a copper foil may be formed by producing a thin film of copper pattered into a shape of the slot electrode 24 including slits by way of screen printing method or the like and then printing same on a back side of the dielectric material 28 made of sintered ceramic. The dielectric material 28 and the processing chamber 40 are joined with the O-ring 90. Employing the third temperature controller 95, which controls the temperature around the dielectric material 28 in a range, e.g., from 80° C. to 100° C. results in the configuration as shown in FIG. 4. The third temperature controller 95 has a flow path 96 surrounding the dielectric material 28 as in the temperature control plate 32. Thus, the third temperature controller can control the temperatures of the dielectric material 28 and the slot electrode 24 and further it can also control the temperature of the O-ring 90 effectively since it is installed close to the O-ring 90. The dielectric material 28 is made of, e.g., aluminum nitride AlN, and serves to prevent the slot electrode 24 from being deformed as a result of pressure application of the processing chamber 40 in a depressurized or vacuum environment to the slot electrode 24, or from being sputtered or generating copper contamination as a result of exposure of the slot electrode 24 to the processing chamber 40. If necessary, the slot electrode 24 may be prevented from being affected by the temperature of the processing chamber 40 by forming the dielectric material 28 with a material having a low thermal conductivity.

Alternatively, the dielectric material 28 can be made of a material having a high thermal conductivity (e.g., AlN) similarly to the wavelength shortening member 22. In such a case, the temperature of the slot electrode 24 can be controlled by controlling the temperature of the dielectric material 28 and the temperature of the wavelength shortening member 22 can be controlled through the slot electrode 24. In this case, it is possible to form a flow path in the dielectric material 28 without preventing the microwave from being introduced into the processing chamber 40. In addition, the above described temperature control schemes can be combined as desired.

The processing chamber 40 is generally formed of a cylindrical shape, whose sidewall and bottom portion are made of a conductor such as aluminum, and an inside thereof can be maintained as a depressurized or vacuum sealed space by the vacuum pump 60 to be described later. The processing chamber 40 accommodates therein a heat plate 42 and the semiconductor wafer W serving as an object to be processed is placed thereon. Further, in FIG. 1, an electrostatic chuck, a clamp mechanism or the like for fixing the semiconductor wafer W is omitted for convenience.

The heat plate 42 has a similar configuration to the heater device 38 and controls the temperature of the semiconductor wafer W. For example, in case of a plasma CVD processing, the heat plate 42 heats the semiconductor wafer W up to an exemplary temperature of about 450° C. Further, in case of a plasma etching processing, the heat plate 42 heats the semiconductor wafer W up to an exemplary temperature of about 80° C. or less. Different heating temperatures are applied by the heat plate 42 for different processes. In any case, the heat plate 42 heats the semiconductor wafer W to prevent water from being adhered thereto or mixed thereinto as an impurity. The second temperature controller 70 can control the amount of heating current flowing in the heat plate 42 in accordance with a temperature measured by the temperature sensor 72, which measures the temperature of the heat plate 42.

A gas supply nozzle 50, made of a quartz pipe, for introducing a reaction gas is installed at a sidewall of the processing chamber 40. The nozzle 50 is coupled to a reaction gas source 58 via the mass flow controller 54 and the opening/closing valve 56 by a gas supply line 52. For example, in case a silicon nitride film is to be deposited, a mixture of a gas mixture (that is, a mixture of $N_2$ and $H_2$ added to any one of neon, xenon, argon, helium, radon and krypton), $NH_3$ and $SiH_4$ can be selected as the reaction gas.

The vacuum pump 60 can vacuum evacuate the processing chamber 40 down to a predetermined pressure (for example, 0.1 to several tens of mTorr). Further, in FIG. 1, a detailed configuration of a gas exhaust system is also omitted.

(Operation of the Plasma Processing Apparatus)

In the following, there will be described an operation of the microwave plasma processing apparatus 100 for the preferred embodiment configured above. First, the semiconductor wafer W is loaded into the processing chamber 40 by a transfer arm through the gate valve (not shown) commonly installed on the sidewall of the processing chamber 40. Then, by moving lifter pins (not shown) vertically, the semiconductor wafer W is mounted on a predetermined mounting surface.

Next, while maintaining the inside of the processing chamber 40 at a predetermined processing pressure, e.g., 50 mTorr, a reaction gas including, e.g., a gaseous mixture of argon and nitrogen is introduced through the nozzle 50 into the processing chamber 40 from the reaction gas source 58 via the mass flow controller 54 and the opening/closing valve 56 at a controlled flow rate thereof.

The temperature of the processing chamber 40 is adjusted to be about 70° C. by the second temperature controller 70 and the heat plate 42. Further, the first temperature controller 30 controls the heater device 38 in order to control the temperature of the temperature control plate 32 to be about 70° C. Accordingly, the temperatures of the wavelength shortening member 22 and the slot electrode 24 are maintained at about 70° C. through the temperature control plate 32. The slot electrode 24 is designed to have the optimum slit length at 70° C. Further, it is known in advance that the slot electrode 24 is allowed to have a temperature error of about ±5° C. as a tolerance range. Since the slot electrode is heated by heat caused by a plasma while the plasma is produced, the temperature of the slot electrode may be controlled to be suppressed while the plasma is produced by supplying the microwave only when the slot electrode is equal to or less than a predetermined temperature.

Meanwhile, the microwave from the microwave source 10 is introduced into the wavelength shortening member 22 in the antenna accommodation member 20, e.g., in a TEM mode through a rectangular waveguide or a coaxial waveguide (not shown). The microwave passing through the wavelength shortening member 22 is incident on the slot electrode 24 with the wavelength thereof shortened, and introduced from the slits 25 into the processing chamber 40 through the dielectric material 28. Since the temperatures of the wavelength shortening member 22 and the slot electrode 24 are controlled, there occurs no deformation caused by, e.g., thermal expansion and the optimum slit length of the slot electrode 24 can be maintained. Thus, the microwave can be introduced into the processing chamber 40 uniformly (that is, without being locally concentrated) and wholly in a desired density (namely, without lowering a density).

If the temperature of the temperature control plate 32 rises above 75° C. due to continuous operation, the first temperature controller 30 controls it to be not higher than 75° C. by introducing cooling water of a temperature of about 15° C. from the water source 39 to the temperature control plate 32. Similarly, when starting a processing or if the temperature of the temperature control plate 32 becomes equal to or less than 65° C. by overcooling, the first temperature controller 30 can control the temperature of the temperature control plate 32 to be equal to or greater than 65° C. by increasing the temperature of water introduced into the temperature control plate 32 from the water source 39 by way of controlling the heater device 38.

Meanwhile, if the temperature sensor 72 detects that the temperature of the processing chamber 40 is equal to or less than a predetermined temperature due to the overcooling by the temperature control plate 32, the second temperature controller 70 can control the temperature of the processing chamber 40 by controlling the heat plate 42 in order to prevent water from being adhered to or mixed into the wafer W as an impurity.

Thereafter, the microwave changes a reaction gas into a plasma and a film containing a curable material and provided on a substrate for electronic device is irradiated with a low energy plasma to thereby cure the corresponding film containing the curable material. This curing process is performed, e.g., for a preset time period, and then, the semiconductor wafer W is unloaded outside of the processing chamber 40 via the above-described gate valve (not shown). Since the microwave having a desired density is uniformly supplied uniformly into the processing chamber 40, a film having a desired thickness is uniformly formed on the wafer W. Further, since the temperature of the processing chamber 40 is maintained at a temperature in which moisture or the like is not mixed into the wafer W, a desired film forming quality can be maintained.

Though there have been explained the preferred embodiments of the apparatus adequately employable in the present invention, various changes and modifications may be made without departing from the spirit and scope of the invention. For example, the microwave plasma processing apparatus 100 of the present invention does not exclude the use of electron cyclotron resonance and thus may have a coil or the like, which generates a magnetic field. Furthermore, though the microwave plasma processing apparatus 100 in the preferred embodiments has been described as the plasma CVD apparatus, it should be appreciated that the microwave plasma processing apparatus 100 can also be employed for the case of etching or cleaning a semiconductor wafer W. In addition, an object to be processed in the present invention is not limited to a semiconductor wafer and may include a LCD and so forth.

While the invention has been shown and described with respect to the preferred embodiments, it will be understood by those skilled in the art that various changes and modifications may be without departing from the spirit and scope of the invention as defined in the following claims.

What is claimed is:

1. A method for forming an insulating film, the method comprising:
    forming a film containing an organic curable material on a substrate;
    irradiating a low energy plasma having an electron temperature of 2 eV or less and produced by a microwave irradiation through a planar antenna member having a plurality of slits to thereby cure the film containing the organic curable material and form the insulating film having a dielectric constant of 3 or less; and
    controlling a temperature of the antenna member by using a temperature controlling member to be set in a temperature range, wherein said controlling comprises controlling the temperature of the antenna member to be in a range from 60° C. to 80° C. in order to improve uniformity of a density of the plasma and to improve quality of the insulating film.

2. The method of claim 1, wherein the film containing the organic curable material is provided by coating on the substrate for an electronic device a solution or a dispersion solution containing the organic curable material and having fluidity.

3. The method of claim 2, wherein the film containing the organic curable material is provided on the substrate for the electronic device by spin coating.

4. The method of claim 3, wherein the plasma is irradiated on the film containing the organic curable material at a temperature of 300 to 400° C.

5. The method of claim 2, wherein the plasma is irradiated on the film containing the organic curable material at a temperature of 300 to 400° C.

6. The method of claim 1, wherein the insulating film obtained by curing is an interlayer insulating film.

7. The method of claim 6, wherein the plasma is irradiated on the film containing the organic curable material at a temperature of 300 to 400° C.

8. The method of claim 1, wherein the plasma is irradiated on the film containing the organic curable material at a temperature of 300 to 400° C.

9. The method of claim 1, wherein the temperature controlling member is a temperature control plate that is in contact with the antenna member and the temperature of the antenna member is controlled by controlling a temperature of the temperature control plate.

10. The method of claim 1, wherein said irradiating comprises irradiating the low energy plasma using a planar antenna having a predetermined design corresponding to said temperature range.

11. The method of claim 10, wherein said using comprises using a planar antenna designed to have a slit length corresponding to the temperature range.

12. The method of claim 10, wherein said controlling comprises controlling the temperature of the antenna member to be in a range from 65° C. to 75° C.

* * * * *